(12) United States Patent
Drill et al.

(10) Patent No.: US 6,410,440 B1
(45) Date of Patent: Jun. 25, 2002

(54) METHOD AND APPARATUS FOR A GASEOUS ENVIRONMENT PROVIDING IMPROVED CONTROL OF CMP PROCESS

(75) Inventors: Charles F. Drill, Boulder Creek; Milind Weling, San Jose, both of CA (US)

(73) Assignee: VLSI Technology, Inc., San Jose, CA (US)

( * ) Notice: Subject to any disclaimer, the term of this patent is extended or adjusted under 35 U.S.C. 154(b) by 0 days.

(21) Appl. No.: 09/305,977

(22) Filed: May 5, 1999

(51) Int. Cl.⁷ ............................................. H01L 21/302
(52) U.S. Cl. ..................... 438/692; 438/690; 438/691; 438/693
(58) Field of Search ................................. 438/690–693

(56) References Cited

U.S. PATENT DOCUMENTS

| | | | |
|---|---|---|---|
| 5,314,843 A | * 5/1994 | Yu et al. ..................... | 437/225 |
| 5,637,185 A | * 6/1997 | Murarka et al. ............... | 438/5 |
| 5,853,604 A | * 12/1998 | Kim ............................ | 216/88 |
| 6,057,245 A | * 5/2000 | Annapragada et al. ...... | 438/706 |
| 6,179,956 B1 | * 1/2001 | Nagahara et al. ........... | 156/345 |

* cited by examiner

Primary Examiner—Benjamin L. Utech
Assistant Examiner—Charlotte A. Brown
(74) Attorney, Agent, or Firm—Wagner, Murabito & Hao LLP

(57) ABSTRACT

A method of using a gaseous environment providing improved control of CMP process. In one embodiment, the method comprises several steps. One step involves placing a semiconductor wafer onto a polishing pad of a CMP machine. A subsequent step dispenses a slurry onto the polishing pad. Another step provides a blanket of gas that displaces the ambient atmosphere surrounding the semiconductor wafer. In another step, the blanket of gas is maintained around the semiconductor wafer during the CMP operation.

14 Claims, 7 Drawing Sheets

METHOD AND APPARATUS FOR A GASEOUS ENVIRONMENT PROVIDING IMPROVED CONTROL OF CMP PROCESS

TECHNICAL FIELD

The field of the present invention pertains to semiconductor fabrication processes. More particularly, the present invention relates to the field of chemical mechanical polishing of a semiconductor wafer.

BACKGROUND ART

Most of the power and usefulness of today's digital integrated circuit (IC) devices can be attributed to the increasing levels of integration. More and more components (resistors, diodes, transistors, and the like) are continually being integrated into the underlying chip, or IC. The starting material for typical ICs is very high purity silicon. The material is grown as a single crystal. It takes the shape of a solid cylinder. This crystal is then sawed (like a slice of bread) to produce wafers typically 10 to 30 cm in diameter and 250 microns thick.

The geometry of the features of the IC components is commonly defined photographically through a process known as photolithography. The photolithography process is used to define component regions and build up components one layer on top of another. Complex ICs can often have many different built up layers, each layer having components, each layer having differing interconnections, and each layer stacked on top of the previous layer. Very fine surface geometry can be accurately produced by this technique. To improve performance of ICs, the density of circuits on a semiconductor wafer is increased. To increase the density of the circuits on the semiconductor wafer, the size of the circuits must be decreased. As the size of the circuits decrease, they become more sensitive to tolerances in the manufacturing operations that create the finished semiconductor wafer. In response to the continued demand for circuit miniaturization, a need arises for improving tolerances in the manufacturing operations that create the finished semiconductor wafer.

One of the sources of manufacturing variation for producing the semiconductor wafer is Chemical mechanical polishing (CMP). CMP is a preferred method of obtaining full planarization of a semiconductor wafer. It involves removing a sacrificial layer of dielectric material using mechanical contact between the wafer and a moving polishing pad saturated with slurry. Polishing flattens out height differences, since high areas of topography (hills) are removed faster than areas of low topography (valleys). Polishing is the only technique with the capability of smoothing out topography over millimeter scale planarization distances leading to maximum angles of much less than one degree after polishing. However, the CMP operation possess variables that affect the flatness, smoothness, and overall consistency of the semiconductor wafer after polishing. Hence, to improve the consistency of the semiconductor wafer following polishing, a need arises to better control the variation in the CMP operation.

One example of the problems that might arise from the CMP operation is the polishing to form metal lines in a semiconductor wafer using the CMP process. For instance, to couple the various discrete components of a circuit, a conductor pattern of lines is constructed between the components formed on the wafer. The conductor pattern is formed in a manner similar to that used to form the semiconductor devices. Oxidation is used to create a dielectric layer to isolate the conductor from the semiconductor portion of the wafer. Etching is used to define trenches for conductors. Chemical or physical vapor deposition is used to deposit a metal (e.g., copper) layer on the dielectric layer. Finally, chemical mechanical polishing (CMP) is typically used to remove the layer of metal from specific areas, usually the non-trench areas of the wafer that are not designed to be conductors. After the polishing operation, metal still remains within the trenches. The resultant product is a semiconductor wafer with metal-filled trenches that couple components.

However, due to the small size of components on conventional ICs, metal lines and other components of the semiconductor wafer are very sensitive to variation in the CMP process. The variations may affect the features or characteristics of the formed metal lines and the components. One potential source of variation is contaminants arising in the polishing operation. Contaminants may include oxygen, water moisture, and any other item that detrimentally affects the polishing operation . The oxygen causes oxidation to occur in elements and compounds. Contaminants can affect the polishing rate, the final geometry, physical properties, and subsequent operations of components in the semiconductor wafer. Hence, a need arises to eliminate contaminants in the CMP process.

Prior Art FIG. 1A is a top view of a chemical mechanical polishing (CMP) machine 100 and Prior Art FIG. 1B is a side view of CMP machine 100. CMP machine 100 is fed semiconductor wafers to be polished. CMP machine 100 picks up the wafers with an arm 101 and places them onto a rotating polishing pad 102. Polishing pad 102 is made of a resilient material and is textured, often with a plurality of predetermined grooves 103, to aid the polishing process. Polishing pad 102 rotates on a platen 104, or turntable located beneath polishing pad 102, at a predetermined speed. A wafer 105 is held in place on polishing pad 102 within a carrier ring 112 that is connected to a carrier film 106 of arm 101. The front surface of wafer 105 rests against polishing pad 102. The back surface of wafer 105 is against the lower surface of carrier film 106 of arm 101. As polishing pad 102 rotates, arm 101 rotates wafer 105 at a predetermined rate. Arm 101 forces wafer 105 into polishing pad 102 with a predetermined amount of down force. CMP machine 100 also includes a slurry dispense arm 107 extending across the radius of polishing pad 102, which dispenses a flow of slurry onto polishing pad 102.

To aid in maintaining a stable removal rate, CMP machine 100 includes a conditioner assembly 120. Conditioner assembly 120 includes a conditioner arm 108, which extends across the radius of polishing pad 102. An end effector 109 is connected to conditioner arm 108. End effector 109 includes an abrasive conditioning disk 110 that is used to roughen the surface of polishing pad 102. Conditioning disk 110 is rotated by conditioner arm 108 and is transitionally moved towards the center of the polishing pad 102 and away from the center of polishing pad 102, such that conditioning disk 110 covers the radius of polishing pad 102. In so doing, conditioning disk 110 covers the surface area of polishing pad 102, as polishing pad 102 rotates. A polishing pad having a roughened surface has an increased number of micro-pits and gouges in its surface from conditioner assembly 120 and therefore produces a faster removal rate via increased slurry transfer to the surface of wafer 105. Without conditioning, the surface of polishing pad 102 is smoothed during the polishing process and removal rate decreases dramatically. Conditioner assembly 120 re-roughens the surface of polishing pad 102, thereby improving the transport of slurry and improving the removal rate.

As described above, the CMP process uses abrasive slurry on a polishing pad. The polishing action of the slurry is comprised of an abrasive frictional component and a chemical component. The abrasive frictional component is due to the friction between the surface of the polishing pad, the surface of the wafer, and the abrasive particles suspended in the slurry. The chemical component is due to the presence in the slurry of polishing agents that chemically interact with the material of the dielectric layer of wafer 105. The chemical component of the slurry is used to soften the surface of the dielectric layer to be polished, while the frictional component removes material from the surface of wafer 105.

Prior art FIG. 2A illustrates a top view, and Prior Art FIG. 2B a cross-section view 1—1, of a semiconductor wafer 200 following the conventional CMP process. The resultant metal line 202 formed in oxide layer 204 of semiconductor wafer 200 by a conventional CMP process can have many defects. Some of the potential defects are illustrated herein.

One possible effect of contaminants in the CMP operation is the formation of oxidation layer on a component in semiconductor wafer. As an example, an oxidation layer 208 formed on metal line 202, or some other portion of semiconductor wafer 200, from the presence of oxygen, water moisture, or other contaminants near the semiconductor wafer 200 before, during, or after the CMP operation. Oxidation layer 208 may affect subsequent fabrication operations on semiconductor wafer 200 such as adhesion of subsequently deposited layers of material. Likewise, oxidation layer 208 may affect the functional characteristics, such as resistance or heat dissipation, of components such as metal line 202. Oxide layer 208 may be a build-up on a portion of semiconductor wafer 200, or it may consume a portion of semiconductor wafer 200 during the oxidation process.

Likewise, the presence of physical contaminants such as dirt or physical particles may affect the flatness or smoothness of the finished semiconductor wafer 200. The particles may be of a size, hardness, or characteristic that detrimentally affects the CMP operation. For example, if a contaminant having an adhesive property contaminated a portion or all of semiconductor wafer 200 prior to, during, or after the CMP operation, the abrasive slurry may not polish the contaminated area in a same pattern or flatness as the uncontaminated portion of semiconductor wafer. As a final example, the contaminant may be larger and harder than the abrasive slurry, and consequently, cause an excessive wear, or a gouge 206 on a portion of semiconductor wafer 200. A gouge can cause an electrical short, adverse physical characteristics, etc. within semiconductor wafer 200. Hence, a need arises to eliminate oxygen, foreign particles, and moisture contaminants in the CMP operation.

In summary, a need exists for a method and system for improving tolerances in the manufacturing operations that create the finished semiconductor wafer. More specifically, a need exists to improve the consistency of the semiconductor wafer polishing process by reducing the variation in the CMP operation. Finally, a need arises to eliminate contaminants in the CMP process. More specifically, a need arises to eliminate oxygen, foreign particles, and moisture contaminants in the CMP operation. The present invention provides a unique and novel solution that meets all the above needs.

DISCLOSURE OF THE INVENTION

The present invention provides a method and system for improving tolerances in the manufacturing operations that create the finished semiconductor wafer. More specifically, the present invention improves the consistency of the semiconductor wafer polishing process by reducing the variation in the CMP operation. Finally, the present invention eliminates contaminants in the CMP process. More specifically, the present invention eliminates oxygen, foreign particles, and moisture contaminants in the CMP operation.

One embodiment of the present invention is a system for performing a chemical mechanical polishing (CMP) operation on a semiconductor wafer. The system is comprised of a chemical mechanical polishing (CMP) machine, a gas manifold and a gas hood. The CMP machine is for polishing a surface of a semiconductor wafer. The CMP machine is comprised of a polishing platen, a carrier and a drive mechanism coupling the polishing platen and the carrier. The gas manifold is coupled to the CMP machine and it supplies gas to the CMP machine. Finally, the gas hood is coupled to the gas manifold. The gas hood is operational for providing a blanket of gas around the semiconductor wafer for the CMP polishing operation.

Another embodiment of the present invention provides a sealed chamber enclosing the CMP machine. The sealed chamber provides an environment where atmospheric gasses can be evacuated from around the semiconductor wafer, and an inert gas injected to surround the semiconductor water. The sealed chamber helps to contain the inert gas, and thereby reduces the consumption, and increases the efficiency, of inert gas during the CMP operation.

These and other advantages of the present invention will no doubt become obvious to those of ordinary skill in the art after having read the following detailed description of the preferred embodiments which are illustrated in the drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

PRIOR ART

PRIOR ART

PRIOR ART

PRIOR ART

The drawings referred to in this description should be understood as not being drawn to scale except if specifically noted.

BEST MODE FOR CARRYING OUT THE INVENTION

Reference will now be made in detail to the preferred embodiments of the invention, a system and method for performing a CMP operation using a gaseous environment, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail as not to unnecessarily obscure aspects of the present invention.

The following detailed description presents the apparatus and method for improving control of the CMP process using a gaseous environment. The apparatus is presented and described first, followed by a flowchart specifically describing the steps involved in the present invention.

Figure 3A:
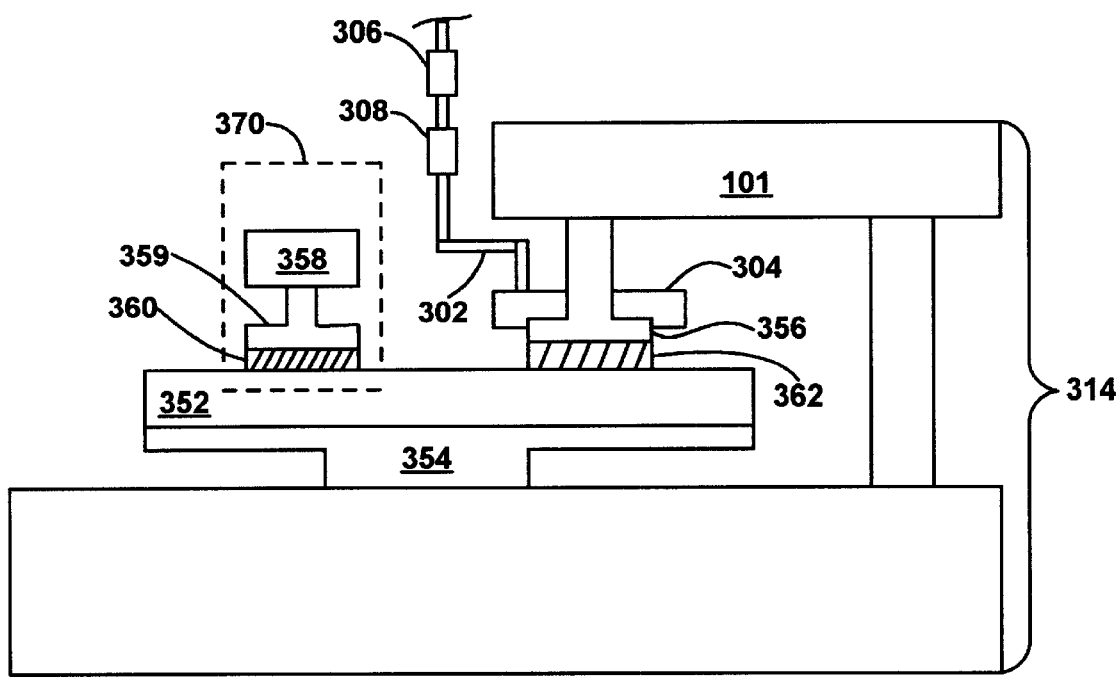
FIG. 3A is a side view of a first system for performing a CMP operation using a gaseous environment, in accordance with one embodiment of the present invention.

FIG. 3A presents a side view of a first system 300a for performing a CMP operation within a gaseous environment, in accordance with one embodiment of the present invention. The purpose of system 300a is to improve the CMP operation on a semiconductor wafer. More specifically, the purpose of system 300a is to remove contaminants from the CMP operation on a semiconductor wafer thereby providing a semiconductor wafer with reduced flaws and improved qualities.

System 300a is comprised of a CMP machine 314 coupled to a gas manifold 302, and a gas hood 304 coupled to gas manifold 302. In this manner, the gas flowing through gas manifold 302 and gas hood 304 can be provided locally around semiconductor wafer 105 improving the environment in which semiconductor wafer 105 is polished. In one embodiment, gas hood 304 will also be disposed around carrier ring 112 due to its proximity to semiconductor wafer.

In another embodiment, a dryer 306 is coupled to gas manifold 302. Dryer 306 removes any moisture in gas flowing through gas manifold 302 prior to being discharged at gas hood 304. Similarly, another embodiment includes a filter 308 coupled to gas manifold 302. Filter 308 removes particles from gas flowing through gas manifold 302.

Figure 3B:
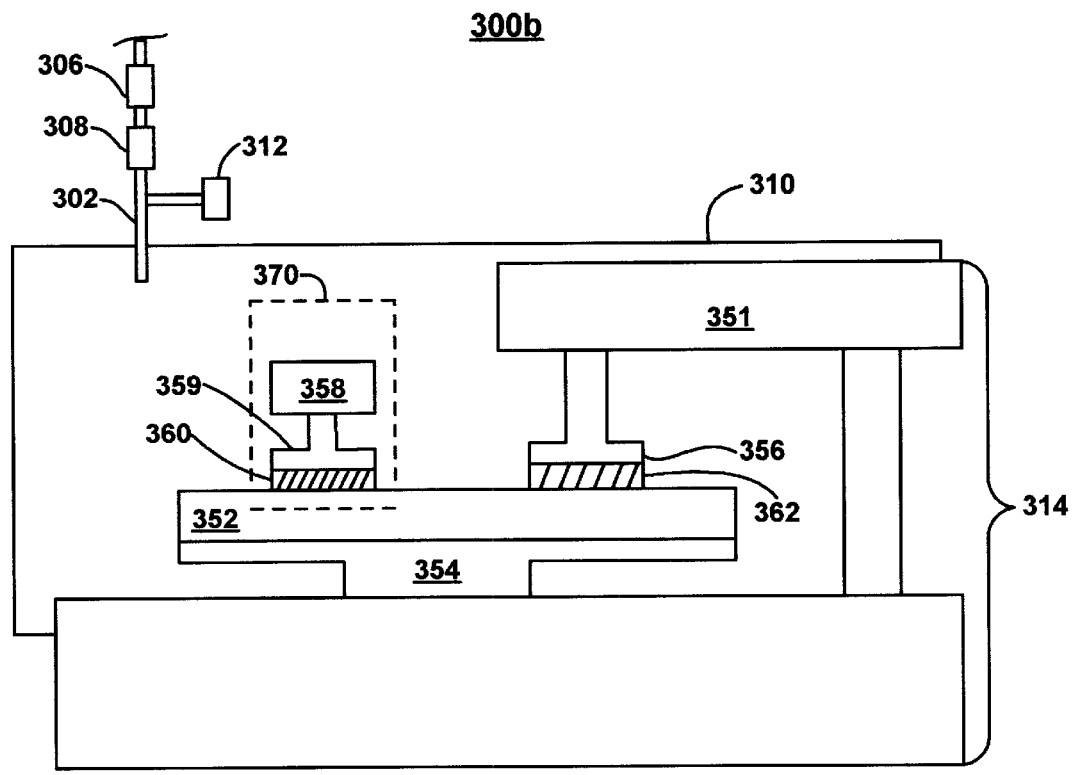
FIG. 3B is a side view of a second system for performing a CMP operation using a gaseous environment, in accordance with one embodiment of the present invention.

A side view of a second system 300b for performing a CMP operation within a gaseous environment, in accordance with one embodiment of the present invention, is presented in FIG. 3B. Similar to first system 300a, the purpose of second system 300b is to improve the CMP operation on a semiconductor wafer. More specifically, the purpose of system 300a is to remove contaminants from the CMP operation on a semiconductor wafer.

System 300b is comprised of a CMP machine 314, a gas manifold 302, and a sealed chamber 310 enclosing semiconductor wafer 105 in CMP machine 314. Sealed chamber is coupled to gas manifold 302 and CMP machine 314. In one embodiment, vacuum source 312 is coupled to gas manifold 302. In this manner, atmospheric gas can be evacuated from sealed chamber 310.

In another embodiment, a dryer 306 is coupled to gas manifold 302. Dryer 306 removes any moisture in gas flowing through gas manifold 302 prior to being discharged at gas hood 304. Similarly, another embodiment includes a filter 308 coupled to gas manifold 302. Filter 308 removes particles from gas flowing through gas manifold 302. The steps for implementing an improved CMP operation are addressed hereinafter.

In both FIG. 3A and FIG. 3B, CMP machine 314 is comprised of an arm 301 that places a wafer 105 onto a rotating polishing pad 352. Polishing pad 352, typically textured with a plurality of predetermined grooves 353, rotates on a platen 354. A wafer 105 is held in place on polishing pad 352 within a carrier ring 362 that is connected to a carrier film 356 of arm 351. The back surface of wafer 105 is against the lower surface of carrier film 356 of arm 351. Arm 351 forces wafer 355 into polishing pad 352 with a predetermined amount of down force. CMP machine 314 also includes a slurry dispense arm 357 extending across the radius of polishing pad 352, which dispenses a flow of slurry onto polishing pad 352.

To aid in maintaining a stable removal rate, CMP machine 314 includes a conditioner assembly 370 comprised of a conditioner arm 358 that extends across the radius of polishing pad 352, and an end effector 359 connected to conditioner arm 358. End effector 359 includes an abrasive conditioning disk 360 that is used to roughen the surface of polishing pad 352. Conditioning disk 360 is rotated by conditioner arm 358 and is transitionally moved towards the center of the polishing pad 352 and away from the center of polishing pad 352, such that conditioning disk 360 covers the radius of polishing pad 352. In so doing, conditioning disk 360 covers the surface area of polishing pad 352, as polishing pad 352 rotates. A polishing pad having a roughened surface has an increased number of micro-pits and gouges in its surface from conditioner assembly 370 and therefore produces a faster removal rate via increased slurry transfer to the surface of wafer 105.

Figure 4:
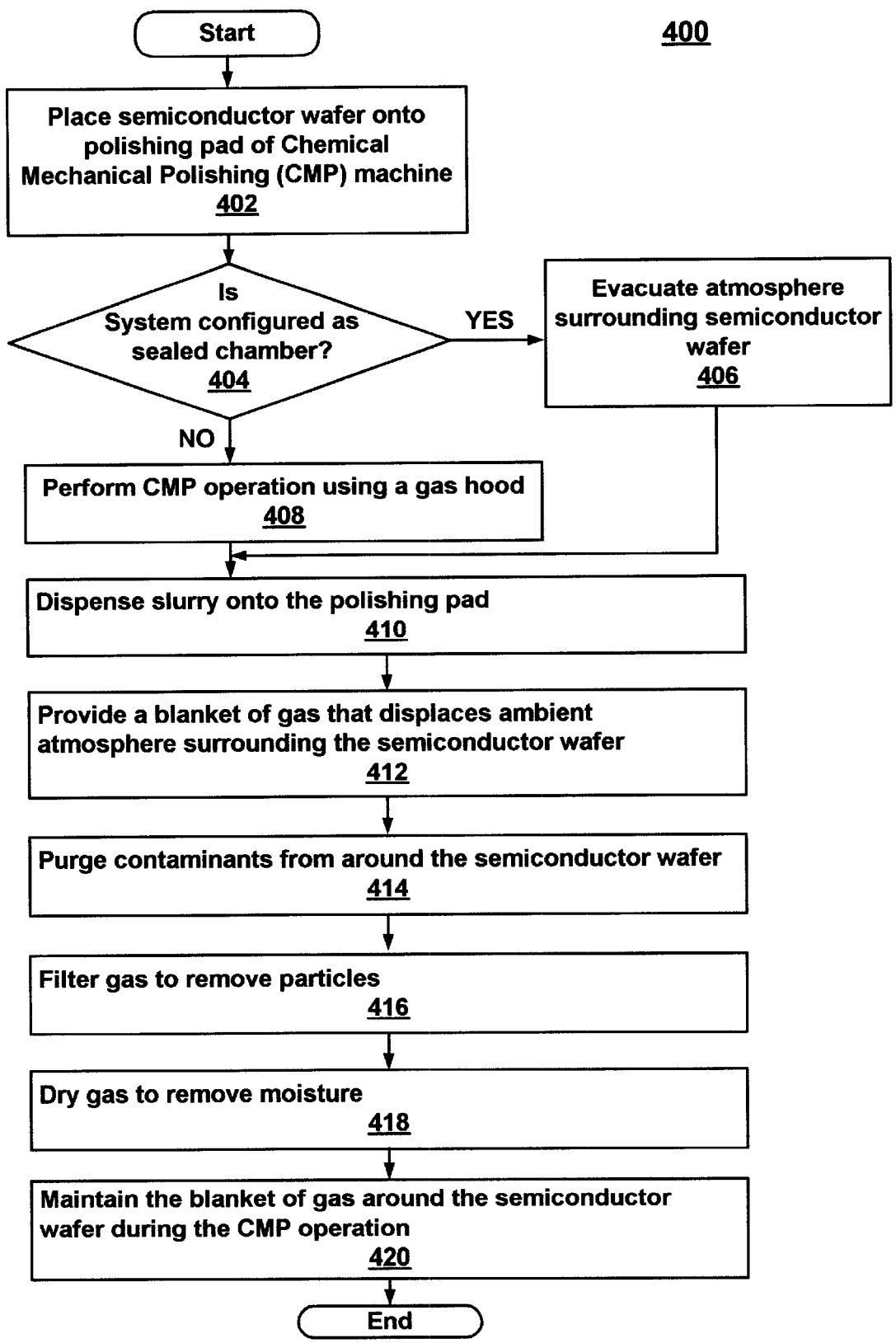
FIG. 4 is a flow chart of the steps performed to improve a CMP operation on a semiconductor wafer, in accordance with one embodiment of the present invention.

FIG. 4 presents a flow chart 400 of the steps performed for operating a CMP machine so as to improve the quality of polished semiconductor wafers, in accordance with one embodiment of the present invention. The steps presented in flowchart 400 will be described with reference to the hardware illustrated in FIGS. 3A and 3B described hereinabove. The steps presented herein improve the CMP operation on a semiconductor wafer. By using these steps, the CMP operation of the present invention provides a semiconductor wafer with fewer defects and better geometrical and physical properties.

In step 402 a semiconductor wafer is placed onto a polishing pad of a Chemical Mechanical Polishing (CMP) machine. As illustrated in FIG. 3A, semiconductor wafer 105 is placed onto polishing pad 352 for subsequent polishing.

In step 404, it is determined whether the system is configured as a sealed chamber. If the system is configured as a sealed chamber, flowchart 400 proceeds to step 406. If the system is not configured as a sealed chamber, then flowchart 400 proceeds to step 408.

In step 406, the atmosphere surrounding semiconductor wafer is evacuated. Referring to FIG. 3B, vacuum source 312 is responsible for evacuating the atmosphere in sealed chamber 310. Although the present configuration evacuates the atmosphere surrounding semiconductor wafer 105, the present invention is well suited to bypassing the evacuation step.

In step 408, a CMP operation is performed using a gas hood. As illustrated in FIG. 3A, gas hood 304 is disposed around carrier ring 362 holding semiconductor wafer 105. In this manner, the present embodiment can provide a blanket of gas, piped through gas manifold 302 and gas hood 304, to surround semiconductor wafer 105 and prevent oxygen, moisture, and contaminants from interfering with the CMP operation on semiconductor wafer 105. Consequently, the present invention provides a semiconductor wafer with improved qualities following the CMP operation.

In step 410, a slurry is dispensed onto the polishing pad. The slurry is the medium by which semiconductor wafer 105 is polished. This step and subsequent steps are common to system 300a using gas hood 302 and to system 300b using sealed chamber 310.

Step 412 provides a blanket of gas that displaces ambient atmosphere surrounding the semiconductor wafer. As illustrated in FIG. 3A and FIG. 3B, regardless of the system used, e.g. gas hood or sealed chamber, a blanket of gas will surround semiconductor wafer 105 to protect it from contaminants. While the present embodiments utilize a gas hood 302 or sealed chamber 310, the present invention is well suited to any structure that provides a blanket of gas around semiconductor wafer 105 to protect it from contaminants.

In step 414, contaminants are purged from around the semiconductor wafer. This step may involve a temporal period over which contaminated atmosphere around semiconductor wafer and other portions of the CMP machine is purged. For example, the machine may be purged for a period of several minutes after loading a semiconductor wafer. The purging step may occur multiple times that occur before, during, or after any steps listed in flowchart 400.

In step 416, gas is filtered to remove particles. This step removes harmful particles from the gas that will surround the semiconductor wafer. As illustrated in FIGS. 3A and 3B, filter 306 is coupled to gas manifold 302. Consequently, gas that flows through gas manifold 302 will be filtered, thereby providing a particle-free gas for the CMP operation. The present invention envisions the use of filters with different size filters, e.g. micron ratings, to remove the appropriate size contaminant for the CMP operation. This step helps prevent the problem noted in Prior Art FIGS. 2A and 2B where gouging 206 detrimentally affects semiconductor wafer 200.

Figure 1A:
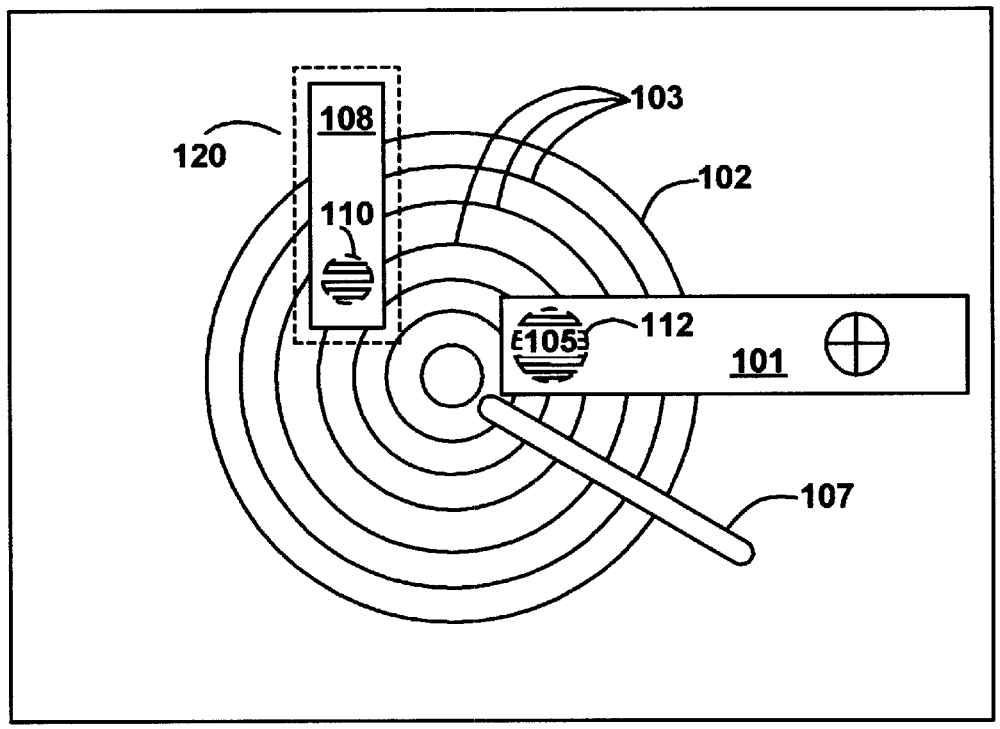
FIG. 1A is a top view of a prior art Chemical Mechanical Polishing (CMP) machine.
Figure 1B:
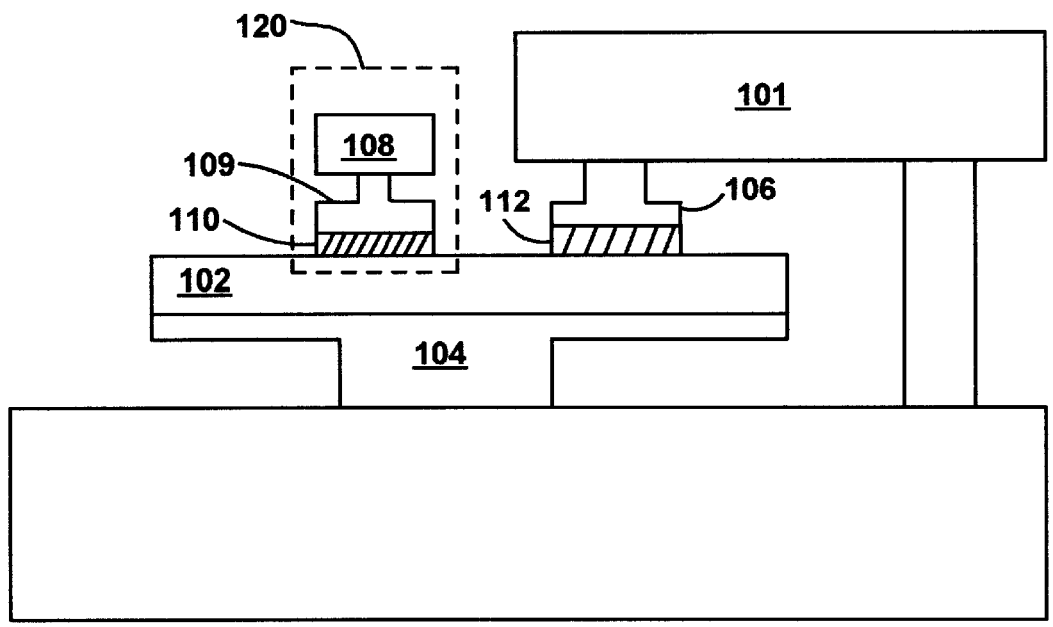
FIG. 1B is a side view of the prior art CMP machine of Prior Art FIG. 1A.
Figure 2A:
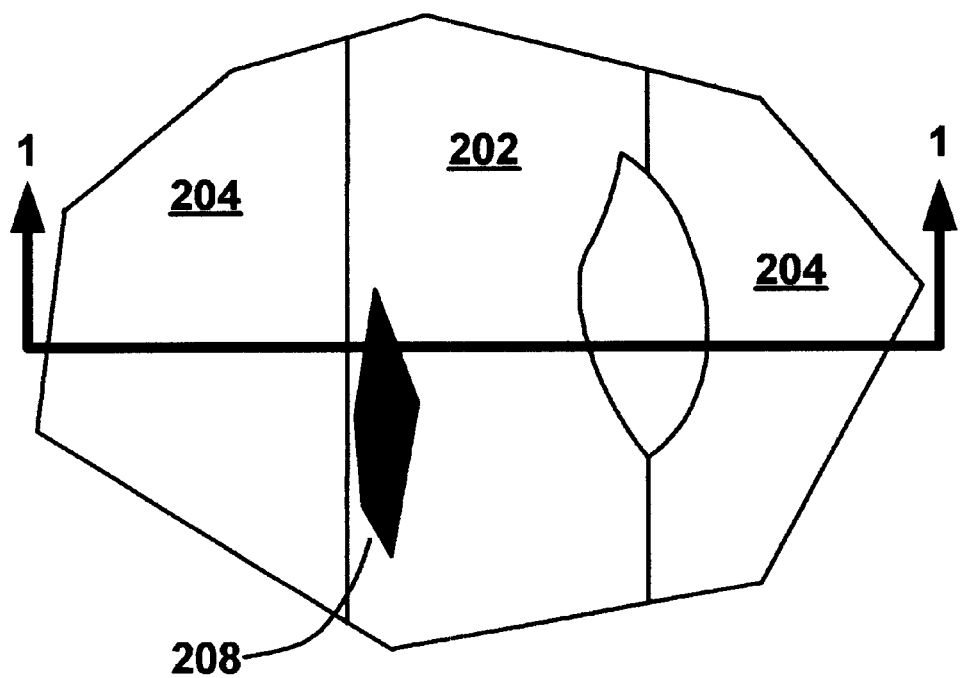
FIG. 2A is a top view of a portion of a prior art semiconductor wafer following a conventional CMP process.
Figure 2B:
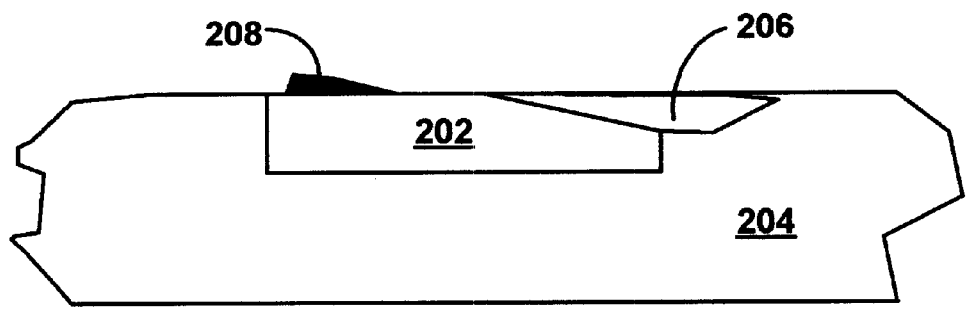
FIG. 2B is a cross-sectional view of a portion of a prior art semiconductor wafer following a conventional CMP process shown in Prior Art FIG. 2A.

Similarly, in step 418, gas is dried to remove moisture. As illustrated in FIGS. 3A and 3B, dryer 308 is coupled to gas manifold 302. In this manner, the gas provided to protect semiconductor wafer 105 is dry. By removing moisture, the problem of oxidation 208 detrimentally affecting semiconductor wafer 200, as shown in Prior Art FIGS. 2A and 2B, is reduced.

Finally, in step 420, the blanket of gas is maintained around the semiconductor wafer during the CMP operation. In this manner, the semiconductor wafer is protected throughout the CMP process. Hence, the semiconductor wafer will be protected from contaminants arising from the CMP operation.

While the previous embodiments have provided gas to protect semiconductor wafer from contaminants such as moisture, particles, and oxygen, the present invention is also well suited to using gas in alternative ways. For example, one embodiment of the present invention could use a gas that is an a reactive gas. The reactive gas could act as a chemical component in the CMP operation.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method for improving a Chemical Mechanical Polishing (CMP) operation on a semiconductor wafer, said method comprising the steps of:

placing a semiconductor wafer onto a polishing pad of a CMP machine;

dispensing a slurry onto said polishing pad;

providing a blanket of gas that displaces the ambient atmosphere surrounding said semiconductor wafer; and maintaining said blanket of gas around said semiconductor wafer during a CMP operation.

2. The method as recited in claim 1 wherein said gas is a reactive gas, said reactive gas acting as a chemical component in said CMP operation.

3. The method as recited in claim 1 wherein said gas is an inert gas, said inert gas eliminating contaminants from said CMP process and thereby improving said CMP operation.

4. The method as recited in claim 1 wherein said inert gas eliminates atmospheric gasses form said CMP process.

5. The method as recited in claim 1 wherein said inert gas eliminates particle contaminant from said CMP process.

6. The method as recited in claim 1 wherein said inert gas eliminates moisture from said CMP process.

7. The method as recited in claim 1 wherein said inert gas comprises Nitrogen gas and Argon gas.

8. The method as recited in claim 1 further comprising the step of:

purging said ambient atmosphere from around said semiconductor wafer for a time period prior to initiating said CMP operation.

9. The method as recited in claim 1 further comprising the step of:

drying said gas prior to displacing the ambient atmosphere surrounding said semiconductor wafer, said drying step to remove moisture contaminant.

10. The method as recited in claim 1 further comprising the step of:

filtering said gas prior to displacing the ambient atmosphere surrounding said semiconductor wafer, said filtering step to remove particle contaminant.

11. The method as recited in claim 1 wherein said CMP process is for Shallow Trench Isolation (STI) processing.

12. The method as recited in claim 1 wherein said CMP process uses a Ceria based slurry.

13. The method as recited in claim 1 further comprising the step of:

performing said CMP process in a sealed chamber.

14. The method as recited in claim 13, further comprising the step of:

evacuating said ambient atmosphere surrounding said semiconductor wafer, from said sealed chamber prior to introducing said gas.

* * * * *